United States Patent [19]
Liron

[11] Patent Number: 5,870,028
[45] Date of Patent: Feb. 9, 1999

[54] INPUT EXPANSION FOR CROSSPOINT SWITCH MODULE

[75] Inventor: John E. Liron, Rough & Ready, Calif.

[73] Assignee: Tektronix, Inc., Wilsonville, Oreg.

[21] Appl. No.: 829,550

[22] Filed: Mar. 28, 1997

[51] Int. Cl.⁶ .............................. G05B 23/02; H04B 3/38; H03B 21/00
[52] U.S. Cl. ...................... 340/825.9; 340/826; 340/827; 340/825.8; 327/107; 327/104
[58] Field of Search ................................ 340/825.09, 826, 340/827, 825.79, 825.8; 327/108, 109, 327

[56] References Cited

U.S. PATENT DOCUMENTS

| | | | |
|---|---|---|---|
| 4,591,740 | 5/1986 | Anderson et al. | |
| 4,748,346 | 5/1988 | Emori | 307/270 |
| 4,870,301 | 9/1989 | Petty | 307/455 |
| 4,912,348 | 3/1990 | Maki et al. | 307/465 |
| 5,289,048 | 2/1994 | Ishihara et al. | |
| 5,331,206 | 7/1994 | Liron. | |
| 5,465,056 | 11/1995 | Hsieh et al. | 326/41 |

*Primary Examiner*—Michael Horabik
*Assistant Examiner*—Anthony A. Asongwed
*Attorney, Agent, or Firm*—Francis I. Gray

[57] ABSTRACT

An input expansion for a crosspoint switch module incorporates a plurality of crosspoint switch ICs within the switch module so that the crosspoint switch module may receive a plurality of input differential signals. The crosspoint switch module includes a module driver circuit which, when enabled by a module enable signal, couples a differential current signal to an output. Each crosspoint switch includes an emitter follower configured transistor circuit for receiving one of the input differential signals and providing an output differential signal and a switch transistor circuit configured as a saturated switch for receiving the output differential signal and providing the differential current signal when enabled by a switch enable signal. Only one of the crosspoint switches is enabled at a time so that only one of the crosspoint switches carries current.

4 Claims, 1 Drawing Sheet

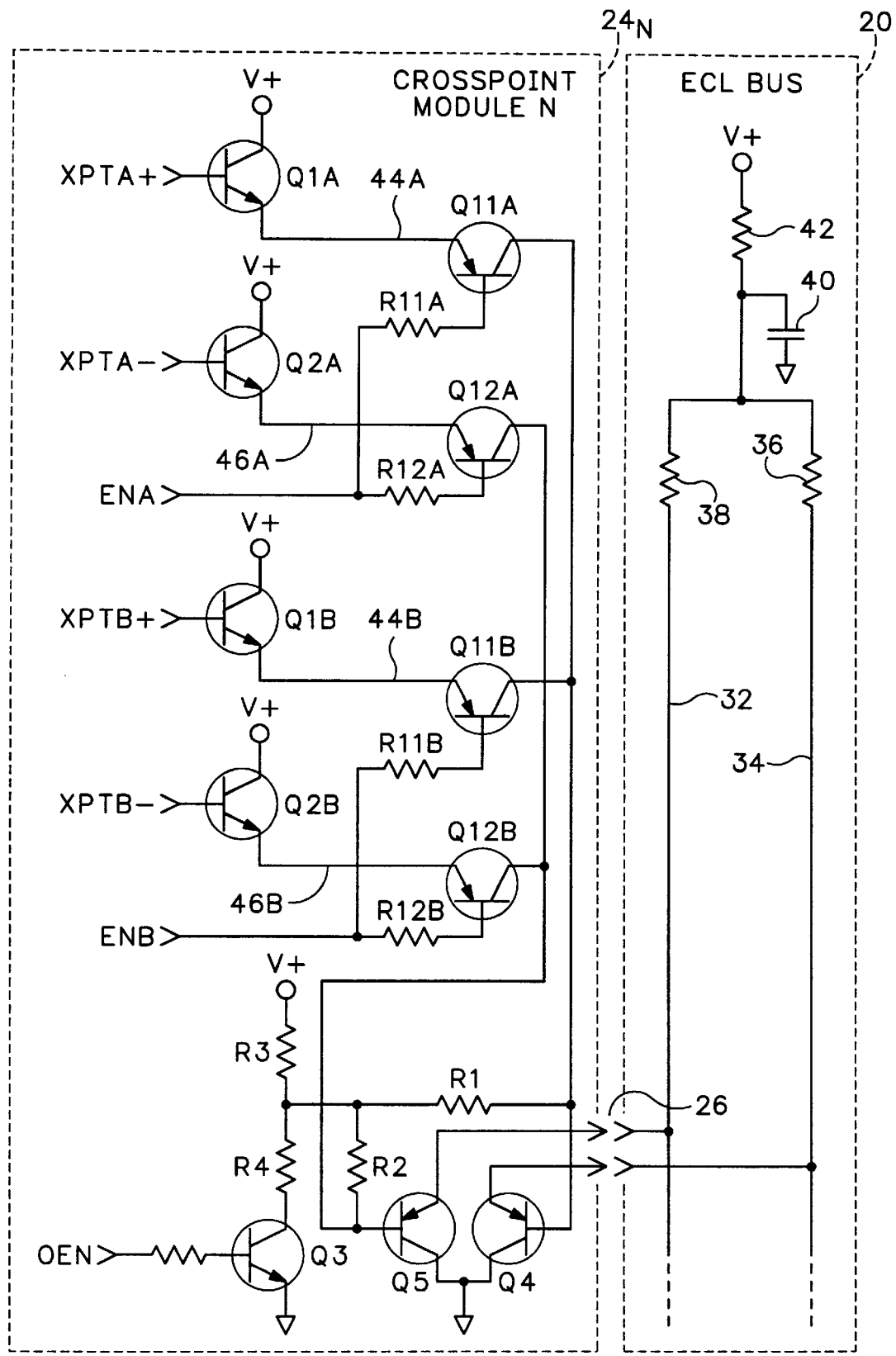

INPUT EXPANSION FOR CROSSPOINT SWITCH MODULE

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

The present invention relates to television routers, and more particularly to an input expansion for a crosspoint switch module that enables the crosspoint switch module to accept a large number of inputs that can be routed to one or more of several outputs.

Traditional means of combining differential ECL outputs involve the use of an n×1 switch where n is the number of ECL outputs to be combined. The number of active differential ECL outputs becomes n+1, i.e., one for every ECL output to be combined plus the output of the n×1 switch itself. In television routing applications a crosspoint switch module is used for switching various video input signals. To increase the density of the crosspoint switch module to accept a large number of inputs, multiple crosspoint switch integrated circuits (ICs) need to be provided within the crosspoint switch module with the ECL outputs being combined to provide the module outputs. Furthermore, it is desirable to shut off current in the ECL output drivers of the inactive crosspoint switch ICs in order to minimize system power consumption.

A presently existing circuit for driving a transmission line is described in U.S. Pat. No. 5,331,206 issued Jul. 19, 1994 to John E. Liron. The Liron circuit has multiple single input crosspoint switch modules coupled to a single output ECL bus for each output of the router. Only one of the crosspoint switch modules provides current to the ECL bus at a time. There are in a large television router up to hundreds of inputs and outputs, but each output needs to be isolated from all of the unselected inputs. The router is made up of many crosspoint switch modules, the outputs of which are combined to form the router output(s), as shown in FIG. 2 of the Liron patent.

What is desired is an input expansion for a crosspoint switch module that combines multiple crosspoint switch integrated circuits (ICs) within the module so that only an active crosspoint switch IC supplies current at the output of the module.

BRIEF SUMMARY OF THE INVENTION

Accordingly the present invention provides an input expansion for a crosspoint switch module by having multiple crosspoint switch integrated circuits (Ics) whose outputs are combined within the module to provide the module output. Each crosspoint switch within the module has an ECL differential output driver emitter follower transistor circuit that can provide current to a differential transmission line coupled to an output switch for the module. For a given output each crosspoint switch is coupled to the same differential transmission line. At the output of each crosspoint switch is a switch that is separately controlled so that only one of the crosspoint switches is activated at any time to provide current to the transmission line. Therefore when the module is activated by a module enable signal and one of the crosspoint switches is enabled by its separate enable command, only the activated crosspoint switch provides current to the module output while the other crosspoint switches do not draw any current, thus enabling the crosspoint switch module to shut off power to all inputs other than those selected to provide the output(s).

The objects, advantages and other novel features of the present invention are apparent from the following detailed description when read in conjunction with the appended claims and attached drawing.

BRIEF DESCRIPTION OF THE SEVERAL VIEWS OF THE DRAWING

The FIGURE is a schematic diagram view of a crosspoint switch module having an input expansion according to the present invention.

DETAILED DESCRIPTION OF THE INVENTION

Referring now to the FIGURE the same numerals are used to indicate corresponding elements to those disclosed in FIG. 2 of the Liron patent, referred to above. One of a plurality of crosspoint switch modules 24N is shown having for the sake of example two input differential ECL signals, XPTA+, XPTA− and XPTB+, XPTB−. The crosspoint switch module 24N is coupled to an ECL bus 20 via an edge connector 26. The ECL bus 20 has two conductors 32, 34 forming a differential transmission line terminated by resistors 36, 38 and capacitor 40. The ECL bus 20 is powered by a pull-up resistor 42 connected between a positive supply voltage V+ and the junction of the resistors 36, 38.

The differential input signals XPTA+, XPTA− and XPTB+, XPTB− are input to respective sets of ECL output driver emitter follower transistors Q1A, Q2A and Q1B, Q2B as described in the Liron patent. The outputs from transistors Q1A, Q2A and Q1B, Q2B are coupled via transmission line 44, 46 to the output transistors Q5, Q4 which are enabled by a module output enable command OEN via resistor R5 and transistor Q3. The operation of the output transistors Q5, Q4 and associated resistor network R1–R4 in isolating the respective modules 24 from each other is described in detail in the Liron patent.

Inserted into the circuit of the Liron patent at the output of the NPN emitter follower driver transistors Q1A, Q2A and Q1B, Q2B and the transmission lines 44A, 46A and 44B, 46B are opposite polarity buffer (PNP) transistors Q11A, Q12A and Q11B, Q12B with respective input resistors R11A, R12A and R11B, R12B. An enable signal ENA or ENB is applied to the bases of one of the sets of buffer transistors Q11A, Q12A or Q11B, Q12B via the input resistors R11A, R12A or R11B, R12B. The emitters of the buffer transistors are coupled to the emitters of the respective driver emitter follower transistors via the transmission lines 44, 46, and the collectors of the buffer transistors are coupled to the bases of the output transistors Q4, Q5.

In operation if the crosspoint switch module is the active crosspoint module coupled to the ECL bus 20, the module enable signal OEN is at V+, providing a current path for one of the sets of the ECL output driver emitter follower transistors as described in the Liron patent. However since each module now has multiple crosspoint switch integrated circuits, means to select the active crosspoint switch IC is provided by the buffer transistors Q11, Q12 which function as common emitter saturating switches. For crosspoint switch IC XPTA to be active, ENA is at ground and ENB is at V+. This causes transistors Q11A, Q12A to turn on and saturate, providing the current path for the emitter follower transistors Q1A, Q2A to the transmission lines 44A, 46A. Transistors Q11B, Q12B are turned off by the high level of ENB so that no current flows from the emitters of emitter follower transistors Q1B, Q2B. If there are more crosspoint switch ICs within the module, their respective enables also would be at V+. This means that current flows only in the active crosspoint switch IC XPTA. If the crosspoint switch module 24N is not the active module on the ECL bus 20, the module enable OEN is at ground, turning off transistor Q3 which shuts off current to all crosspoint switch output driver emitter follower transistors Q1, Q2 regardless of the state of their respective enable signals.

Thus the present invention provides for input expansion of crosspoint switch modules by including multiple crosspoint switch ICs within each module that are coupled to the module output switch by respective switches enabled by individual enable signals for each crosspoint switch IC.

We claim:

1. In a crosspoint switch system having a plurality of crosspoint switch modules with outputs coupled to an output transmission line, each crosspoint switch module has a module output driver for coupling a signal at the input of the module output driver to the output transmission line when enabled by a module enable signal and further comprises a plurality of crosspoint switches, each of the crosspoint switches having as an input a separate one of a plurality of input differential signals and having as an output when activated by a switch enable signal a differential current signal, only one of the crosspoint switches being activated at one time, the outputs of the crosspoint switches being coupled together via differential transmission lines to the input of the module output driver so that when the crosspoint switch module is enabled by the module enable signal only the input differential signal activated by the one switch enable signal is coupled by the module output driver to the output transmission line.

2. The crosspoint switch module as recited in claim 1 wherein each crosspoint switch comprises:

an emitter follower transistor circuit having the one of the input differential signals as an input and providing an output differential signal as an output; and a switch transistor circuit having the output differential signal and the switch enable signal as inputs and providing as an output the differential current signal when enabled by the switch enable signal.

3. The crosspoint switch module as recited in claim 2 wherein the emitter follower transistor circuit comprises a pair of emitter follower configured transistors each having a base for receiving the input differential signal and an emitter for providing the output differential signal.

4. The crosspoint switch module as recited in claim 3 wherein the switch transistor circuit comprises a pair of transistors configured as saturating switches each having an emitter for receiving the output differential signal, a base for receiving the switch enable signal and a collector for providing the differential current signal.

* * * * *